US008435608B1

(12) United States Patent
Subramonium et al.

(10) Patent No.: US 8,435,608 B1
(45) Date of Patent: May 7, 2013

(54) METHODS OF DEPOSITING SMOOTH AND CONFORMAL ASHABLE HARD MASK FILMS

(75) Inventors: Pramod Subramonium, Salem, OR (US); Zhiyuan Fang, West Linn, OR (US); Shawn Hancock, Newberg, OR (US); Mike Pierce, West Linn, OR (US); Jon Henri, West Linn, OR (US)

(73) Assignee: Novellus Systems, Inc., Fremont, CA (US)

( * ) Notice: Subject to any disclaimer, the term of this patent is extended or adjusted under 35 U.S.C. 154(b) by 1295 days.

(21) Appl. No.: 12/163,670

(22) Filed: Jun. 27, 2008

(51) Int. Cl.
*H05H 1/24* (2006.01)

(52) U.S. Cl.
USPC ........................................................ 427/569

(58) Field of Classification Search .................... 427/569
See application file for complete search history.

(56) References Cited

U.S. PATENT DOCUMENTS

| | | | |
|---|---|---|---|
| 3,816,976 A | 6/1974 | Stork et al. |
| 4,209,357 A | 6/1980 | Gorin et al. |
| 4,274,841 A | 6/1981 | Andersen et al. |
| 4,668,261 A | 5/1987 | Chatzipetros et al. |
| 4,863,493 A | 9/1989 | Kotani et al. |
| 4,863,760 A | 9/1989 | Schantz et al. |
| 4,975,144 A | 12/1990 | Yamazaki et al. |
| 5,222,549 A | 6/1993 | Ishii et al. |
| 5,231,057 A | 7/1993 | Doki et al. |
| 5,261,250 A | 11/1993 | Missimer |
| 5,378,316 A | 1/1995 | Franke et al. |
| 5,470,661 A | 11/1995 | Bailey et al. |
| 5,562,952 A | 10/1996 | Nakahigashi et al. |
| 5,670,066 A | 9/1997 | Barnes et al. |
| 5,792,269 A * | 8/1998 | Deacon et al. ................ 118/715 |
| 5,985,103 A * | 11/1999 | Givens et al. ............ 204/192.12 |
| 6,006,797 A | 12/1999 | Bulow et al. |
| 6,030,591 A | 2/2000 | Tom et al. |
| 6,035,803 A | 3/2000 | Robles et al. |
| 6,041,734 A | 3/2000 | Raoux et al. |
| 6,066,209 A | 5/2000 | Sajoto et al. |
| 6,150,719 A | 11/2000 | Saia et al. |
| 6,241,793 B1 | 6/2001 | Lee et al. |
| 6,286,321 B1 | 9/2001 | Glater |
| 6,319,299 B1 | 11/2001 | Shih et al. |
| 6,331,480 B1 | 12/2001 | Tsai et al. |
| 6,367,413 B1 | 4/2002 | Sill et al. |
| 6,465,051 B1 | 10/2002 | Sahin et al. |
| 6,478,924 B1 | 11/2002 | Shamouilian et al. |
| 6,541,397 B1 | 4/2003 | Bencher |
| 6,573,030 B1 | 6/2003 | Fairbairn et al. |
| 6,617,553 B2 | 9/2003 | Ho et al. |
| 6,777,349 B2 | 8/2004 | Fu et al. |
| 6,967,072 B2 | 11/2005 | Latchford et al. |
| 7,220,982 B2 | 5/2007 | Campbell |
| 7,223,526 B2 | 5/2007 | Fairbairn et al. |
| 7,314,506 B2 | 1/2008 | Vininski et al. |
| 7,323,401 B2 | 1/2008 | Ramaswamy et al. |
| 7,381,644 B1 | 6/2008 | Subramonium et al. |
| 7,495,984 B2 | 2/2009 | Kim et al. |
| 7,820,556 B2 | 10/2010 | Hsu et al. |
| 7,915,166 B1 | 3/2011 | Yu et al. |
| 7,955,990 B2 | 6/2011 | Henri et al. |
| 7,981,777 B1 | 7/2011 | Subramonium et al. |
| 7,981,810 B1 | 7/2011 | Subramonium et al. |
| 8,110,493 B1 | 2/2012 | Subramonium et al. |
| 2001/0021491 A1 | 9/2001 | Chen et al. |
| 2002/0182848 A1 | 12/2002 | Joseph et al. |
| 2003/0044532 A1 | 3/2003 | Lee et al. |
| 2004/0016972 A1 | 1/2004 | Singh et al. |
| 2004/0018750 A1 | 1/2004 | Sophie et al. |
| 2004/0023502 A1 | 2/2004 | Tzou et al. |
| 2004/0140506 A1 | 7/2004 | Singh et al. |
| 2004/0180551 A1 | 9/2004 | Biles et al. |
| 2004/0224504 A1 | 11/2004 | Gadgil |
| 2004/0266195 A1 | 12/2004 | Dokumaci et al. |
| 2005/0042889 A1 | 2/2005 | Lee et al. |
| 2005/0098119 A1 | 5/2005 | Burger et al. |
| 2005/0112506 A1 | 5/2005 | Czech et al. |

(Continued)

FOREIGN PATENT DOCUMENTS

| | | |
|---|---|---|
| FR | 2853313 | 10/2004 |
| JP | 62019539 | 1/1987 |

(Continued)

OTHER PUBLICATIONS

U.S. Appl. No. 11/612,382, Office Action mailed Feb. 24, 2009.
U.S. Appl. No. 11/612,382, Office Action mailed May 12, 2009.
U.S. Appl. No. 11/710,377, Office Action mailed Aug. 19, 2009.
U.S. Appl. No. 12/133,223, Office Action mailed Aug. 19, 2009.
U.S. Appl. No. 11/449,983, Office Action mailed Sep. 15, 2009.
U.S. Appl. No. 11/612,382, Office Action mailed Dec. 9, 2009.
U.S. Appl. No. 12/133,223, Office Action mailed Dec. 21, 2009.
U.S. Appl. No. 12/133,223, Notice of Allowance mailed Mar. 2, 2010.
U.S. Appl. No. 11/710,377, Office Action mailed Mar. 31, 2010.
U.S. Appl. No. 11/612,382, Office Action mailed Mar. 26, 2010.

(Continued)

*Primary Examiner* — Jessee R. Roe
(74) *Attorney, Agent, or Firm* — Weaver Austin Villeneuve & Sampson LLP

(57) ABSTRACT

Provided are plasma enhanced chemical vapor deposition methods of depositing smooth and conformal ashable hard mask films on substrates containing raised or recessed features. The methods involve using precursors having relatively high C:H ratios, such as acetylene (C:H ratio of 1), and plasmas having low ion energies and fluxes. According to various embodiments, the methods involve depositing smooth ashable hard mask films using high frequency radio frequency-generated plasmas with no low frequency component and/or relatively high pressures (e.g., 2-5 Torr). Also provided are methods of depositing ashable hard mask films having good selectivity and improved side wall coverage and roughness. The methods involve depositing a first ashable hard mask film on a substrate having a feature using a process optimized for selectivity and/or optical properties and then depositing a smoothing layer on the first ashable hard mask film using an HF-only process.

20 Claims, 12 Drawing Sheets

U.S. PATENT DOCUMENTS

| | | | |
|---|---|---|---|
| 2005/0130404 | A1 | 6/2005 | Moghadam et al. |
| 2005/0260411 | A1* | 11/2005 | Ravi .............................. 428/408 |
| 2006/0091559 | A1 | 5/2006 | Nguyen et al. |
| 2006/0154086 | A1 | 7/2006 | Fuller et al. |
| 2006/0197881 | A1 | 9/2006 | Kang et al. |
| 2006/0205223 | A1 | 9/2006 | Smayling |
| 2007/0032054 | A1 | 2/2007 | Ramaswamy et al. |
| 2007/0048674 | A1 | 3/2007 | Wells |
| 2007/0054500 | A1 | 3/2007 | Bencher |
| 2007/0059913 | A1 | 3/2007 | King et al. |
| 2007/0105303 | A1 | 5/2007 | Busch et al. |
| 2007/0125762 | A1 | 6/2007 | Cui et al. |
| 2007/0128538 | A1 | 6/2007 | Fairbairn et al. |
| 2007/0140029 | A1 | 6/2007 | Kim et al. |
| 2007/0166546 | A1 | 7/2007 | Ichikawa et al. |
| 2007/0166979 | A1 | 7/2007 | Wang et al. |
| 2007/0202640 | A1 | 8/2007 | Al-Bayati et al. |
| 2007/0247073 | A1 | 10/2007 | Paterson et al. |
| 2008/0073636 | A1 | 3/2008 | Kim |
| 2008/0083916 | A1 | 4/2008 | Kim |
| 2008/0128907 | A1 | 6/2008 | Yang et al. |
| 2008/0200003 | A1 | 8/2008 | Hong et al. |
| 2008/0242912 | A1 | 10/2008 | Letessier et al. |
| 2008/0254641 | A1 | 10/2008 | Kobayashi et al. |
| 2008/0264803 | A1 | 10/2008 | Agrawal |
| 2009/0182180 | A1 | 7/2009 | Huang et al. |
| 2009/0305516 | A1 | 12/2009 | Hsu et al. |
| 2010/0151691 | A1 | 6/2010 | Henri et al. |
| 2010/0297853 | A1 | 11/2010 | Hsu et al. |

FOREIGN PATENT DOCUMENTS

| | | |
|---|---|---|
| JP | 08152262 | 6/1996 |
| KR | 10-0986503 | 10/2010 |
| SU | 382671 | 5/1973 |
| WO | 2005/048367 | 5/2005 |

OTHER PUBLICATIONS

U.S. Appl. No. 12/766,721, "Methods for Forming Conductive Carbon Films by PECVD", Fox et al., filed Apr. 23, 2010.

U.S. Appl. No. 12/786,842, "Method for purifying acetylene gas for use in semiconductor processes", Hsu et al., filed May 25, 2010.

U.S. Appl. No. 11/449,983, Office Action mailed Jun. 21, 2010.

KR patent application No. 2009-0048358, Office Action mailed Jun. 1, 2010.

U.S. Appl. No. 11/849,208, Office Action mailed Sep. 3, 2010.

U.S. Appl. No. 12/048,967, Office Action mailed Nov. 22, 2010.

U.S. Appl. No. 11/449,983, Office Action mailed Dec. 30, 2010.

U.S. Appl. No. 12/334,220 Notice of Allowance mailed Nov. 2, 2010.

Allowed Claims for U.S. Appl. No. 12/334,220 as of Nov. 2, 2010.

U.S. Appl. No. 11/449,983, Notice of Allowance mailed Mar. 16, 2010.

U.S. Appl. No. 11/449,983, Allowed Claims as of Mar. 16, 2011.

U.S. Appl. No. 11/710,377, Notice of Allowance mailed Mar. 22, 2011.

U.S. Appl. No. 11/710,377, Allowed Claims as of Mar. 22, 2011.

U.S. Appl. No. 11/849,208, Final Office Action mailed Apr. 12, 2011.

Supplemental Notice of Allowance for U.S. Appl. No. 12/334,220, mailed Feb. 8, 2011.

U.S. Appl. No. 12/048,967, Office Action mailed Apr. 18, 2011.

Subramonium et al., "Methods of Depositing Highly Selective Transparent Ashable Hardmask Films", U.S. Appl. No. 13/160,399, filed Jun. 14, 2011.

U.S. Office Action mailed Dec. 14, 2006, from U.S. Appl. No. 11/318,269.

Ikeda et al., "Top-PECVD": A New Conformal Plasma Enhanced CVD Technology using TEOS, Ozone and Pulse-modulated RF Plasma,' 1992 IEEE, pp. 11.2.1-11.2.4.

Subramonium et al., "Methods of Depositing Highly Selective Transparent Ashable Hardmask Films", U.S. Appl. No. 11/449,983, filed Jun. 8, 2006.

Subramonium et al., "Methods of Depositing Stable and Hermetic Ashable Hardmask Films," Novellus Systems, Inc., U.S. Appl. No. 11/710,377, filed Feb. 22, 2007, pp. 1-26.

Notice of Allowance and Fee Due mailed May 7, 2007 from U.S. Appl. No. 11/318,269.

Allowed Claims from U.S. Appl. No. 11/318,269.

Fang et al., "Methods of Improving Ashable Hardmask Adhesion to Metal layers," Novellus Systems, Inc., U.S. Appl. No. 11/612,382, filed Dec. 18, 2006.

U.S. Office Action mailed Oct. 9, 2007, from U.S. Appl. No. 11/612,382.

Grill, et al. "Diamondlike carbon films by rf plasma-assisted chemical vapor deposition from acetylene," IBM J. Res. Develop., vol. 34, No. 6, Nov. 1990, pp. 849-857.

Callegari et al., "Optical properties of hydrogenated amorphous-carbon film for attenuated phase-shift mask applications," J.Vac. Sci. Technol. B 11(6), Nov./Dec. 1993, pp. 2697-2699.

Grill, A., "Diamond-like carbon: state of the art," Diamond and Related Mateials 8 (1999) 428-434.

Grill, A., "Plasma-deposited diamondlike carbon and related materials," IBM Journal of Research and Development, vol. 43, ½, 1999, http://research.ibm.com/journal/rd/431/grill.html. 14 pages.

Kragler et al., "Scanning tunneling microscopy based lithography employing amorphous hydrogenated carbon as a high resolution resist mask," Appl. Phys. Lett. 67 (8), Aug. 21, 1995, pp. 1163-1165.

U.S. Office Action mailed Dec. 27, 2007, from U.S. Appl. No. 11/449,983.

Subramonium et al., "Pulsed PECVD Method for Modulating Hydrogen Content in Hard Mask," Novellus Systems, Inc., U.S. Appl. No. 12/048,967, filed Mar. 14, 2008.

Subramonium et al., "Methods and Apparatus for Plasma-Based Deposition," Novellus Systems, Inc., U.S. Appl. No. 11/849,208, filed Aug. 31, 2007.

U.S. Office Action mailed Jul. 9, 2008, from U.S. Appl. No. 11/449,983.

U.S. Final Office Action mailed May 13, 2008, from U.S. Appl. No. 11/612,382.

U.S. Office Action mailed Aug. 19, 2008, from U.S. Appl. No. 11/612,382.

Hsu et al., "Method for Purifying Acetylene Gas for Use in Semiconductor Processes," Novellus Systems, Inc., U.S. Appl. No. 12/133,223, filed Jun. 4, 2008.

U.S. Office Action mailed Jan. 5, 2009, from U.S. Appl. No. 11/449,983.

U.S. Office Action mailed Jan. 5, 2009, from U.S. Appl. No. 11/710,377.

Henri, et al., Method for Improved Thickness Repeatability of PECVD Deposited Carbon Films, Novellus Systems, Inc., U.S. Appl. No. 12/334,220, filed Dec. 12, 2008.

U.S. Appl. No. 12/786,842, Office Action mailed Nov. 9, 2011.

U.S. Appl. No. 12/048,967, Notice of Allowance mailed Oct. 7, 2011.

U.S. Appl. No. 12/048,967, Allowed Claims, Oct. 7, 2011.

Holmes et al., "Trimethylsilylacetylene", Organic Syntheses, Coll. vol. 8, p. 606 (1993); vol. 65, p. 61 (1987).

Voronkin et al., "Structure and mechanical properties of a-C:H films deposited onto polymer substrates", Diamond and Related Materials, 4 (1994) 5-9.

US Office Action, dated Aug. 27, 2007, issued in U.S. Appl. No. 11/318,269.

US Notice of Allowance, dated Jan. 7, 2008, issued in U.S. Appl. No. 11/318,269.

US Office Action, dated Jun. 1, 2007, issued in U.S. Appl. No. 11/612,382.

U.S. Appl. No. 13/032,392, filed Feb. 22, 2011, entitled "Improved Diffusion Barrier and Etch Stop Films".

US Final Office Action, dated Sep. 14 2012, issued in U.S. Appl. No. 11/849,208.

US Notice of Allowance, dated Jul. 20, 2012, issued in U.S. Appl. No. 12/786,842.

Jacobsohn et al. (1998) "Hydrogenated Carbon-Nitrogen Films Obtained by PECVD Using Acetylene and Nitrogen As Precursor Gases," Mat. Res. Soc. Symp. Proc., 498: 283-288.

Muhl et al. (1999) "A Review of the Preparation of Carbon Nitride Films," Diamond and Related Materials, 8: 1809-1830.

van de Ven et al. (1990) "Advantages of Dual Frequency PECVD for Deposition of ILD and Passivation Films," VLSI Multilevel Interconnection Conference Proceedings, Seventh International IEEE, 194-201.

US Office Action, dated Aug. 10, 2012, issued in U.S. Appl. No. 12/766,721.

US Final Office Action dated Apr. 19, 2012 issued in U.S. Appl. No. 12/786,842.

Franz Kreupl et al., "Carbon-Based Resistive Memory", IEDM, 2008.

Henri et al., U.S. Patent Application entitled: "Carbon Film for Resistive Memory", U.S. Appl. No. 12/756,731, filed Apr. 8, 2010.

* cited by examiner

US 8,435,608 B1

METHODS OF DEPOSITING SMOOTH AND CONFORMAL ASHABLE HARD MASK FILMS

FIELD OF THE INVENTION

This invention relates to a novel method of producing ashable hard masks in semiconductor processing.

BACKGROUND OF THE INVENTION

Hard masks are used as etch stop layers in semiconductor processing. Ashable hard masks have a chemical composition that allows them to be removed by a technique referred to as ashing once they have served their purpose. An ashable hard mask is generally composed of carbon & hydrogen with trace amount of one or more dopants (e.g., nitrogen, fluorine, boron, silicon). The bonding structure in these hard masks can vary from sp2 (graphite-like) to sp3 (diamond-like) or a combination of both, depending on the deposition conditions. In a typical application, after etching the hard mask has served its purpose and must be removed from the underlying layer. This is generally accomplished, at least in part, by ashing, also referred to as plasma ashing or dry stripping.

SUMMARY OF THE INVENTION

Provided are plasma enhanced chemical vapor deposition methods of depositing smooth and conformal ashable hard mask films on substrates containing raised or recessed features. The methods involve using precursors having relatively high C:H ratios, such as acetylene (C:H ratio of 1), and plasmas having low ion energies and fluxes. According to various embodiments, the methods involve depositing smooth ashable hard mask films using high frequency radio frequency-generated plasmas with no low frequency component and/or relatively high pressures (e.g., 2-5 Torr). Also provided are methods of depositing ashable hard mask films having good selectivity and improved side wall coverage and roughness. The methods involve depositing a first ashable hard mask film on a substrate having a feature using a process optimized for selectivity and/or optical properties and then depositing a smoothing layer on the first ashable hard mask film using an HF-only process.

BRIEF DESCRIPTION OF THE DRAWINGS

FIG. 2b shows a basic schematic illustrating ARL deposition on the ashable hard mask film shown in FIG. 2a.

FIG. 3a shows a front view of a side wall and bottom surface of the trench, while FIG. 3b shows a cross sectional view of the ashable hard mask film.

FIG. 5 also shows a rendering of the image.

FIG. 6 also shows a rendering of the image.

DETAILED DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

Hard masks are used as etch stop layers in semiconductor processing. Ashable hard masks have a chemical composition that allows them to be removed by a technique referred to as ashing once they have served their purpose. An ashable hard mask is generally composed of carbon & hydrogen with trace amount of one or more dopants (e.g., nitrogen, fluorine, boron, silicon). In a typical application, after etching the hard mask has served its purpose and is removed from the underlying layer. This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

Hard mask layers are often used in narrow and/or deep contact etch applications, where photoresist may not be thick enough to mask the underlying layer. This is especially applicable as the critical dimension shrinks.

Figure 1:
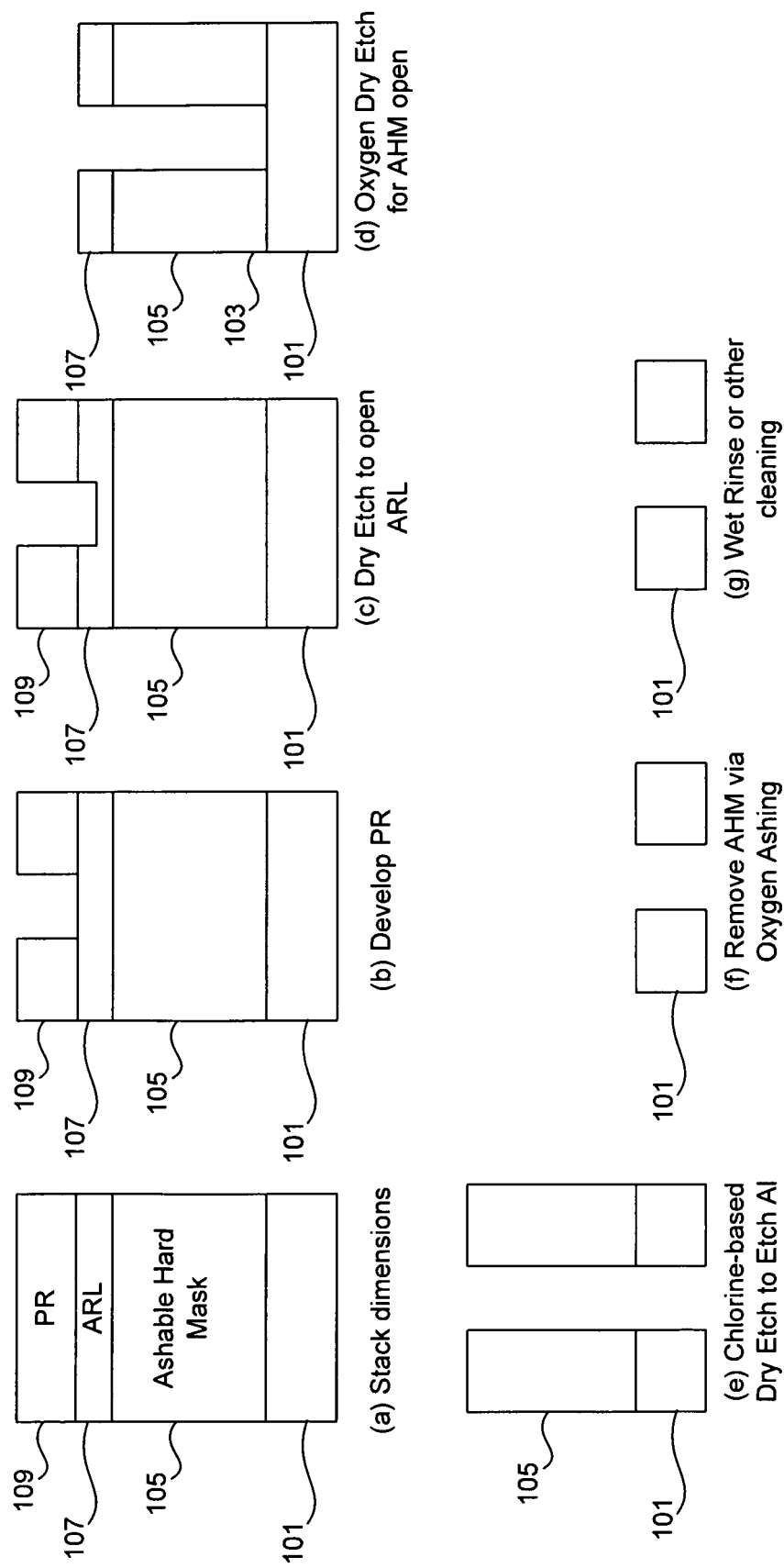
FIG. 1 depicts an exemplary scheme for patterning a substrate using an ashable hard mask film.

In certain integration schemes, ashable hard masks are used to pattern layers. An example of a process using an ashable hard mask for patterning according to an embodiment of the present invention is presented in FIG. 1. First in operation (a) a film stack is provided. In the example depicted in FIG. 1, the film stack includes a layer 101 to be patterned. This layer may be a dielectric, metal, or other type of layer. An ashable hard mask layer 105 is deposited over the layer 101. In various embodiments, other layers may be present between the layer to be patterned and the ashable hard mask; for example, an adhesion layer may be used. An anti-reflective layer (ARL) 107 is deposited on the ashable hard mask 105, and a layer of photoresist 109 is over the ARL. The photoresist is patterned and developed in an operation (b), and the ARL is opened by a dry etch process in an operation (c). Another dry etch process, e.g., an oxygen-based etch, is then performed in an operation (d) to open the ashable hard mask. Layer 101 is etched in an operation (e) to create the desired pattern, e.g., using a chlorine-based dry etch. The remaining ashable hard mask is removed by ashing in an operation (f). Remaining residue may be removed in an operation (g) by a wet rinse or other cleaning techniques. The result is the desired patterned film.

Figure 2A:
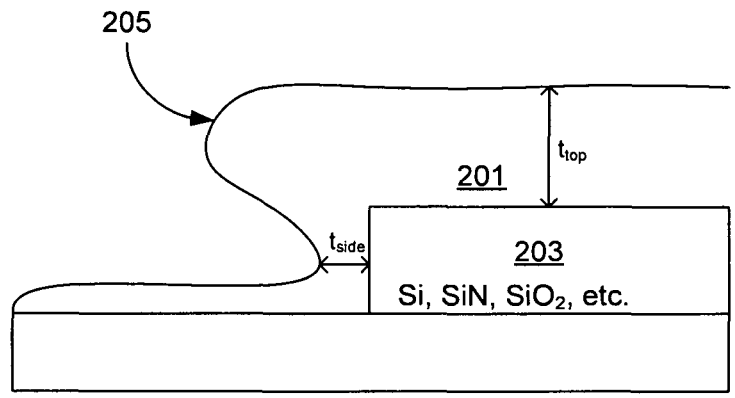
FIG. 2a shows a basic schematic illustrating an example of an ashable hard mask film deposited by a conventional process on a raised feature.
Figure 3A:
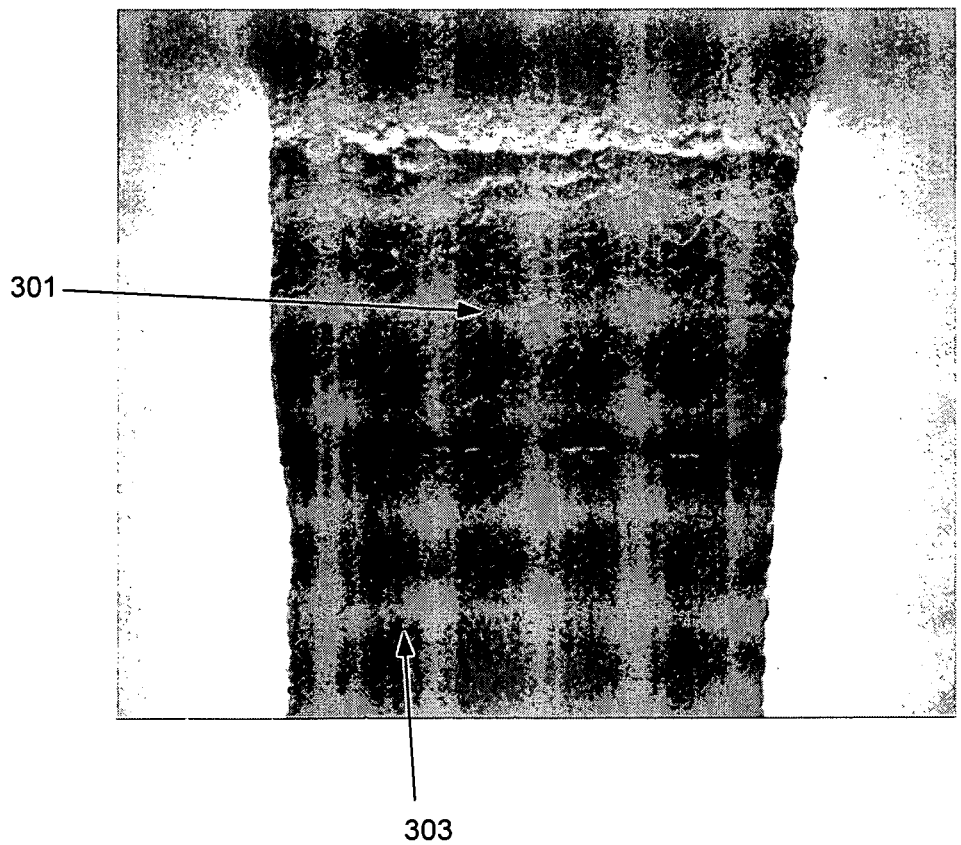
FIGS. 3a and 3b are SEM images of an ashable hard mask deposited in a trench.
Figure 3B:
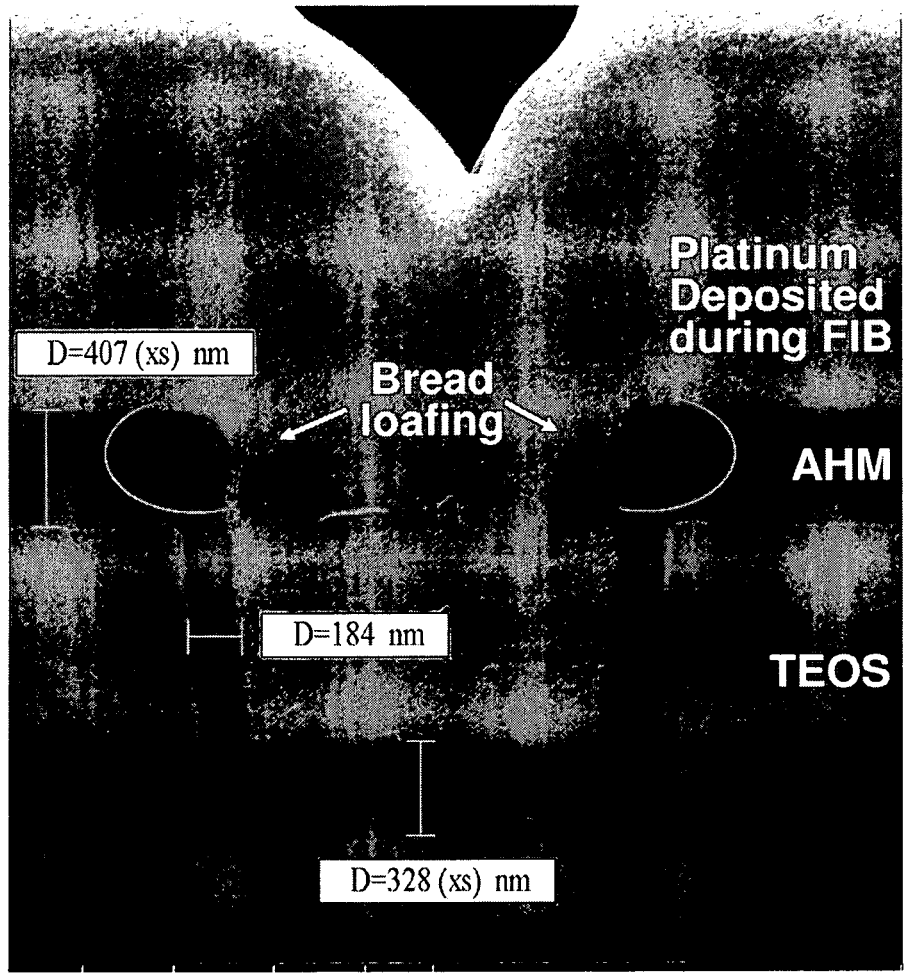

Ashable hard masks deposited by traditional plasma enhanced chemical vapor deposition (PECVD) techniques have poor step coverage, in particular, low side wall coverage when deposited on recessed or raised features such as alignment marks or in double patterning schemes. FIG. 2a shows a basic schematic illustrating an example of an ashable hard mask film 201 deposited by a conventional process on a raised feature 203. FIGS. 3a and 3b are SEM images of an ashable hard mask deposited in a trench. FIG. 3a shows a front view of the side wall 301 with bottom surface 303, while FIG. 3b shows a cross sectional view of the ashable hard mask film deposited in a trench formed in TEOS layer. (The thick layer on top of the ashable hard mask is platinum deposited during the focused ion beam process used to prepare the sample for imaging).

Several features of the film as deposited by a conventional process make it difficult to use for various applications. First, side wall coverage is poor. Side wall coverage as used herein refers to the minimum thickness of film deposited on feature side wall/thickness of film deposited on feature top. Thickness of film deposited on the side wall of the raised feature in FIG. 2a is shown as $t_{side}$, with thickness on the top shown as $t_{top}$. Side wall coverage in FIG. 3b is 184/407, or about 45%. Ashable hard masks deposited by conventional processes typically get only 20-49% side wall coverage. Another issue with conventional processes is the roughness of the coverage on the side wall. In FIG. 3a, for example, side wall 301 is rough, while the bottom surface 303 is smooth. In addition to poor side wall coverage and side wall roughness, conventional processes result in overhang or "bread-loafing" at the top corners of the features. In FIG. 2a, this is indicated at 205.

Figure 2B:
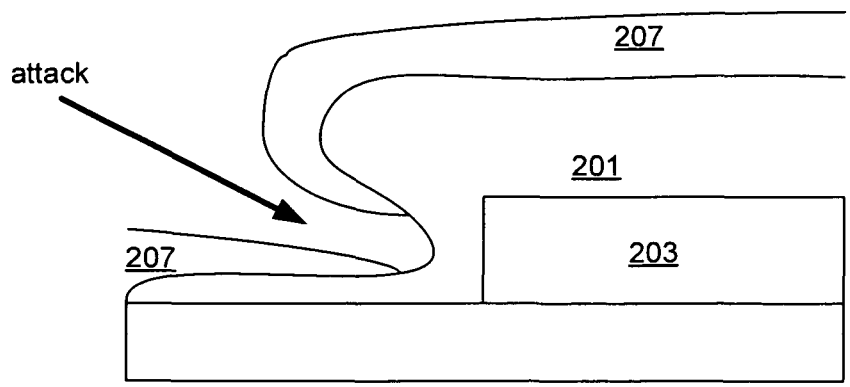

Overhang, roughness and poor step coverage result in poor uniformity for the subsequently deposited ARL. ARLs cannot uniformly cover the side walls of ashable hard masks formed by conventional processes. This is shown schematically in FIG. 2b, where ARL 207 does not uniformly cover the ashable hard mask 201. During lithographic rework, when the photoresist is ashed away, underlying ashable hard mask on side wall is also attacked as a protective ARL is missing. This results in expensive wafer scrap. Similar lithographic rework issues can also arise from high roughness of ashable hard mask films. Roughness of ashable hard mask films can lead to ARL cracking, which then results in attack of ashable hard mask during rework through these cracks. The alignment mark or other feature 203 may also be attacked at that time if there is no ashable hard mask film left to protect it.

Described herein are ashable hard mask films on raised or recessed features that have improved step coverage, less or no overhang and/or less or no roughness and the methods of depositing these films. Using appropriate precursor selection, frequency of RF power used to generate the plasma, and pressure as described herein to deposit the films, ashable hard mask films may be deposited on raised or recessed features having step coverage ranging from about 50%-100%, reduced roughness and overhang may be formed. These films then provide improvements in downstream processing and enable ashable hard masks to be used for applications that require high step coverage and low roughness.

Figure 4:
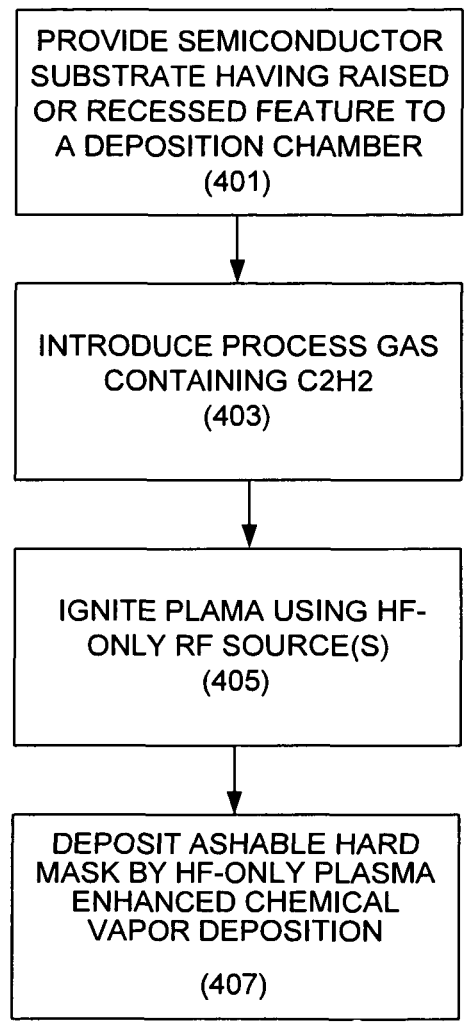
FIG. 4 is a process flow sheet illustrating major operations in method of depositing an ashable hard mask layer according to certain embodiments.

FIG. 4 is a process flow sheet illustrating major operations in method of depositing an ashable hard mask layer according to certain embodiments. The process begins by providing a substrate having a raised or recessed feature to a deposition chamber. Block 401. Feature dimensions for which the processes described herein are most useful typically range from 0.02 to 10 microns in width and 0.05 to 10 microns in height. The substrate surface may be metal, dielectric or semiconductor material. The feature may be a raised step on the surface, made out the same or different material as the substrate surface, or it may be a recessed feature etched into the substrate surface. A process gas containing acetylene is then introduced into the chamber. Block 403. Although many $C_xH_y$ precursors have been used in previous hard mask deposition process, it has been found that actelyene provides unexpectedly good (low) roughness and step coverage as compared to similar precursors such as propylene. Certain other precursors also provide good step coverage and may be used in accordance with the methods described herein. This is described further below. Typically the process gas contains only one type of hydrocarbon precursor. Other process gases may include hydrogen, nitrogen and helium or other inert gases. Chamber pressure may vary, though as described below, relatively high pressure (2-5 Torr) has been found to provide smoother film. A plasma is then ignited using a high frequency radio frequency (HFRF) source, with no LF component. Block 405. The HF power may range from low (<200 W) to 5000 W high. An ashable hard mask film is then deposited by a HF-only plasma enhanced chemical vapor deposition process. Block 407. Using no LF component is significant as conventional processes use low frequency (LF) component to deposit ashable hard mask films. As discussed further below, the use of a HF-only plasma is one part of the process space that provides smooth films with good step coverage.

Figure 5:
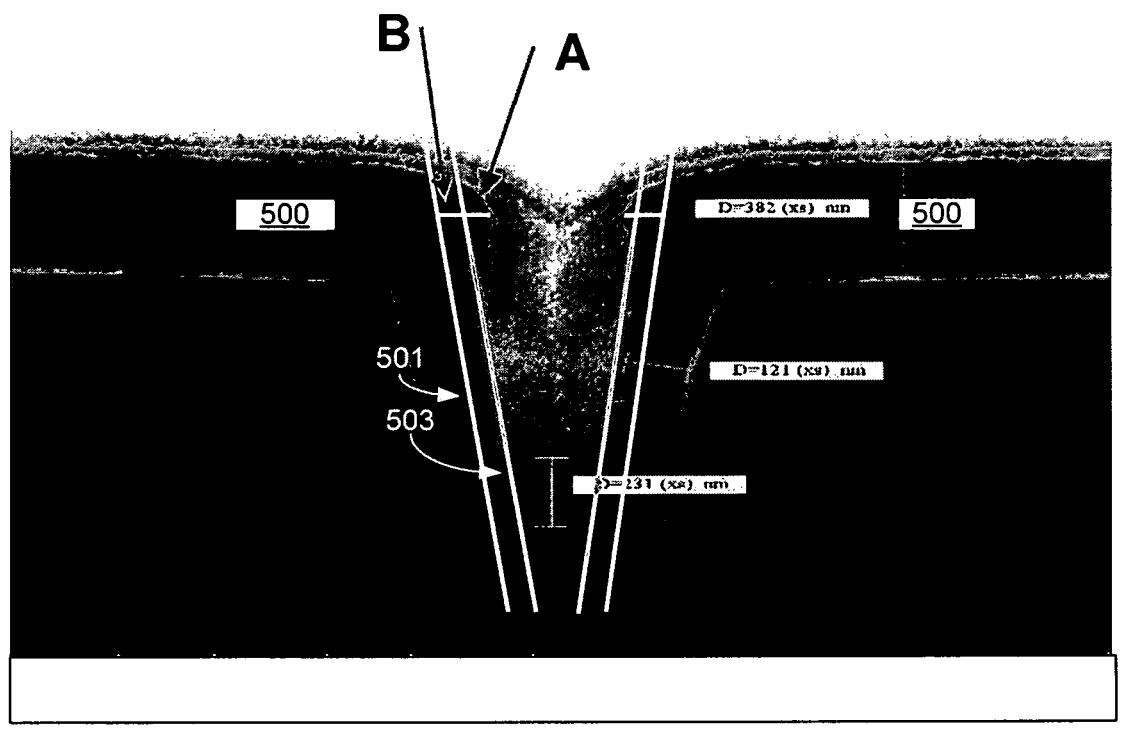
FIG. 5 shows an image of an example of an ashable hard mask film deposited in a feature.
Figure 5:
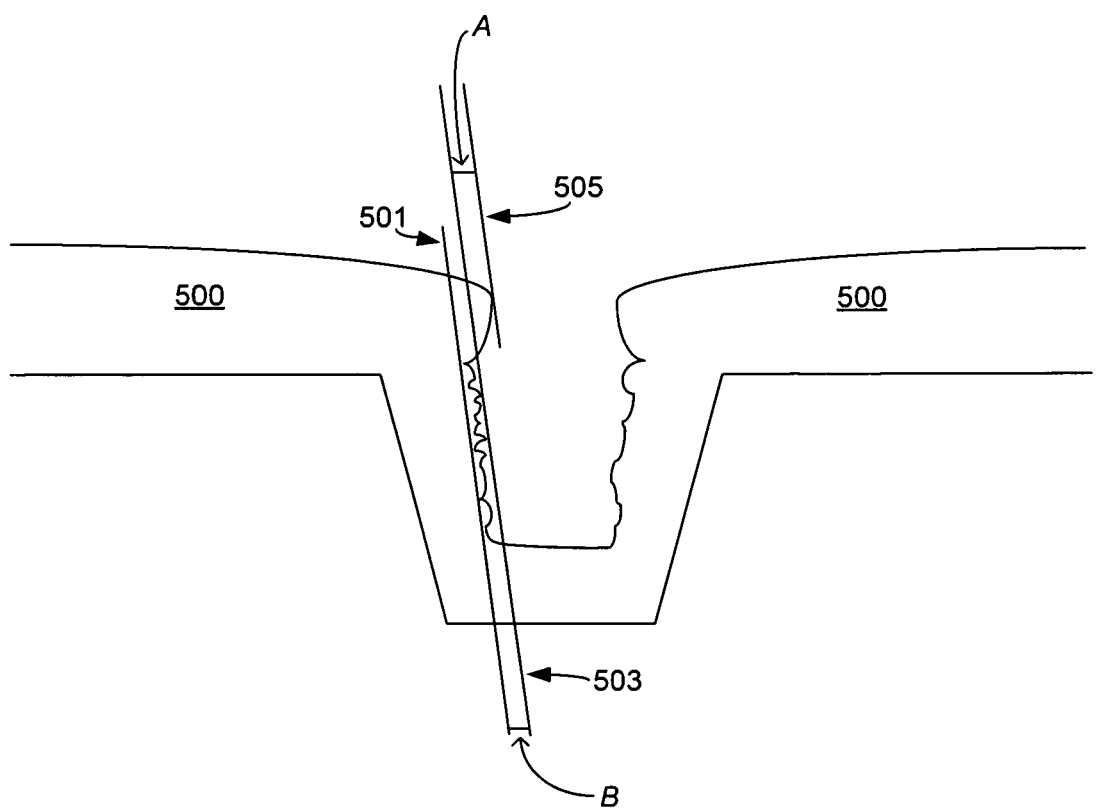

Precursor selection as well as process conditions have been shown to provide unexpectedly good step coverage and low roughness. As indicated above, one measure of step coverage is comparing side thickness $t_{side}$ to top thickness $t_{top}$: the better the side wall coverage is, the closer the ratio $t_{side}/t_{top}$ is to one. In certain cases (such as those in prior art methods) the thickness of film deposited on a feature side wall varies significantly due to poor deposition uniformity. In these instances, side thickness is measured from the thinnest point. Step coverage of bottom thickness to top thickness may also be examined. In addition to step coverage, overhang and roughness are also quantifiable. FIG. 5 shows an image of an example of ashable hard mask film 500 deposited in a feature. Two lines are drawn: line 503 parallel to the side wall of the feature and touching longest projection(s) of the rough film and line 501 along the smooth ashable hard mask film (as can be seen from the image, the film deposited to the right of the line 501 is rough). A distance A is measured from the end of the side wall of the (rough) ashable hard mask (line 503) to the thickest part of the overhang. This distance, A, is a measure of the overhang. A distance B is measured from the end of the side wall (line 503) to the smooth ashable hard mask film (line 501). This distance, B, is a measure of the roughness. A schematic diagram is also shown to illustrate these measures, with a line 505 along the thickest part of the overhang drawn parallel to line 501 to measure the distance A. Percent overhang and percent roughness are calculated by dividing these distance by the top thickness, $t_{top}$:

% overhang=$A/t_{top}$

% roughness=$B/t_{top}$

These two measures can also be combined to provide a measure of the overhang and roughness:

% roughness+overhang=$(A+B)/t_{top}$

These measurements may be determined for both sides of the feature.

Conventional ashable hard masks have a step coverage of less than 50% and are produced using various hydrocarbon precursors using a high ion energy/flux process space. These processes have been LF driven to increase deposition rate and etch selectivity. The methods described herein, however, provide significantly improved step coverage as well as reduced roughness and overhang by using a process space using specific precursors and process conditions, including RF frequency and pressure. While the discussion below refers to each of these in turn, it should be noted that certain embodiments, the use of specific precursors in the process space described results in synergistic effects that achieve conformal films. For example, as discussed below, while propylene is commonly used in the formation of ashable hard mask films, it has been found that it does not form smooth and conformal ashable hard mask films.

One characteristic of the process space of the methods described herein to deposit smooth ashable hard mask films is using high frequency only to generate the plasma used to deposit the films. Plasma enhanced chemical vapor deposition (PECVD) processes typically use capacitively-coupled plasmas, which may be generated using RF plasma sources. In conventional processes, at least some amount of low frequency (LF) is used. (The high frequency RF component is generally between 2-60 MHz; e.g., 13.56 MHz. The LF component is can be from 100 kHz-1 MHz, typically around 400 kHz.) It has been found, however, that HF-only processes produce films having much higher conformality. The table below shows selected, representative data from different three different processes used to deposit ashable hard mask films: Process A uses 2400 W LFRF and process B is a HF-only process. Side wall step coverage improves over 50%, from 40% to 72% and bottom coverage improves to 94%. Even low amounts of LF were found to significantly affect step coverage: process C is identical to process B, with the exception of the addition of 400 W LF. Step coverage is as poor as with process A.

TABLE 1

HF-only RF and step coverage

|   | C2H2 Flow rate (sccm) | He Flow rate (sccm) | N2 Flow rate (sccm) | H2 Flow rate (sccm) | Temp (Celsius) | Pressure (Torr) | LF (W) | HF (W) | $t_{side}/t_{top}$ | $t_{bottom}/t_{top}$ |
|---|---|---|---|---|---|---|---|---|---|---|
| A | 5000 | 2500 | 0 | 300 | 275 | 0.9 | 2400 | 400 | 40% | 67% |
| B | 500 | 1500 | 1500 | 0 | 300 | 2 | 0 | 100 | 72% | 94% |
| C | 500 | 1500 | 1500 | 0 | 300 | 2 | 400 | 100 | 40% | 62% |

Without being bound by a particular theory, it is believed that the increase in step coverage using the HF-only process is due to the lower ion energy resulting from removing the LF component. Roughness and overhang are also significantly better for the HF-only processes described herein as compared with conventional processes. Table 2 shows representative data from several processes performed at 300° C.:

TABLE 2

HF-only RF and roughness and overhang

|   | C2H2 Flow rate (sccm) | He Flow rate (sccm) | H2/N2 Flow rate (sccm) | Pressure (Torr) | LF (W) | HF (W) | Side | Roughness | Overhang |
|---|---|---|---|---|---|---|---|---|---|
| D | 6000 | 2500 | 1500/0 | 1.2 | 2400 | 400 | Left | 13.2% | 13.2% |
|   |   |   |   |   |   |   | Right | 13.2% | 6.2% |
| E | 6000 | 2500 | 0/0 | 2 | 1200 | 400 | Left | 10.6% | 2.3% |
|   |   |   |   |   |   |   | Right | 10.6% | 2.3% |
| F | 5000 | 6000 | 0/1500 | 4.5 | 0 | 1750 | Left | 0.0% | 0.0% |
|   |   |   |   |   |   |   | Right | 0.0% | 0.0% |

Figure 6:
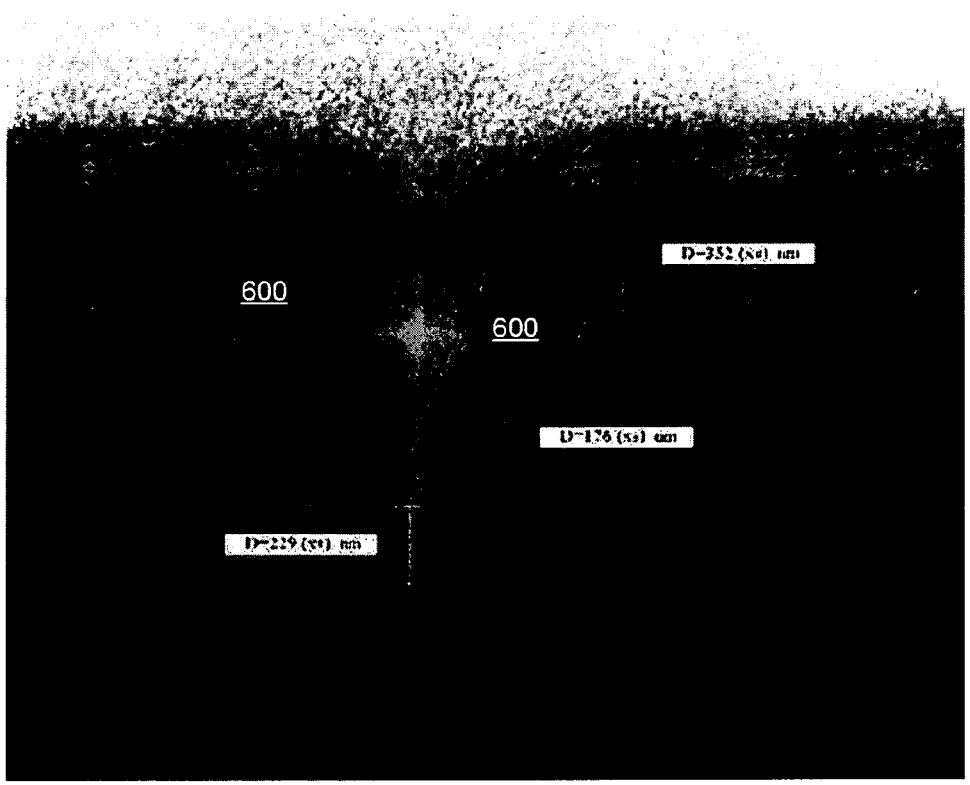
FIG. 6 shows an image of an example of an ashable hard mask film deposited according to a method described herein.
Figure 6:
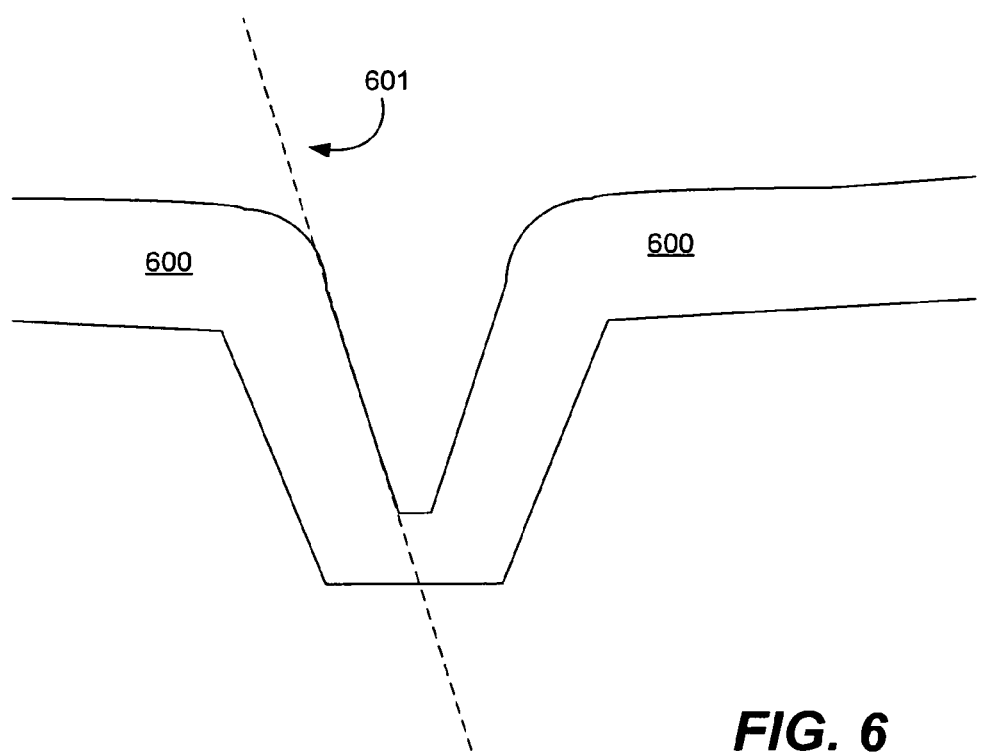
Figure 7:
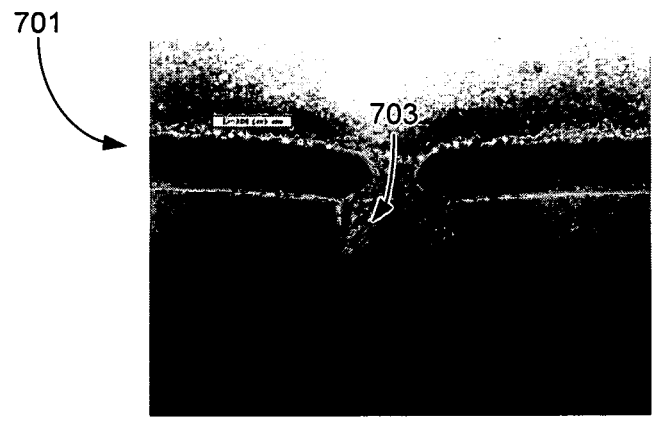
FIG. 7 shows an image of an ashable hard mask film deposited in a recessed feature of about 500 nm width using propylene as a precursor. The film is discontinuous along the side wall. For comparison, FIG. 7 also shows an image of an ashable hard mask film deposited in the same size feature using acetylene.
Figure 7:
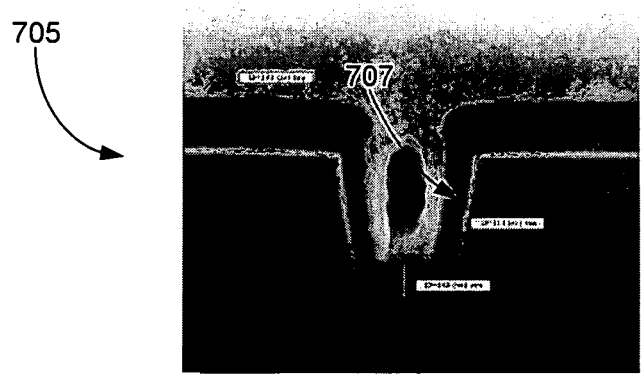

Remarkably, process F, the HF-only process, shows no roughness or overhang. FIG. 6 shows an image of the feature with ashable hard mask film 600 deposited on it. Unlike the film in FIG. 5, deposited using a process such as process D, there is no roughness—the edge of the smooth ashable hard mask film is the same as the edge of the film. For comparison with comparison, an image 705 of an ashable hard mask film deposited in the same size feature using acetylene is also shown. The film, indicated at 707, is continuous. Table 3, below, shows additional data comparing side coverage for acetylene and propylene based films. (The films deposited by processes G and H are shown in FIG. 7).

TABLE 3

| | | | | | | | | | | |
|---|---|---|---|---|---|---|---|---|---|---|
| | | | | C2H4 vs. C3H6 | | | | | | |
| | Precursor and Flow rate (sccm) | He Flow rate (sccm) | N2 Flow rate (sccm) | H2 Flow rate (sccm) | Temp (Celsius) | Pressure (Torr) | LF (W) | HF (W) | Side thickness (nm) | $t_{side}/t_{top}$ |
| G | C2H2/5000 | 2500 | 0 | 3000 | 275 | 0.9 | 2400 | 400 | 111 | 67% |
| H | C3H6/5000 | 2500 | 0 | 3000 | 275 | 0.9 | 2400 | 400 | discontinuous | 0% |
| I | C2H2/5400 | 13500 | 1500 | 0 | 400 | 7.5 | 1800 | 250 | 117 | 40% |
| J | C3H6/5400 | 13500 | 1500 | 0 | 400 | 7.5 | 1800 | 250 | discontinuous | 0% |

FIG. 5, line 601 is drawn along the smooth ashable hard mask film (as is line 501 in FIG. 5); this line is also along the rough edge of the side wall (as is line 503 in FIG. 5). Thus, the distance B and the roughness is zero. There is also no portion of the film that extends beyond line 601, so the distance A and the overhang is zero. The side wall step coverage also improved from about 32% to about 47%. It should be noted that the improvements in step coverage and roughness will also be realized for processes that contain an LF component that is not large enough to substantially affect ion energy, and that the methods described herein encompass these processes as well.

In certain embodiments, another characteristic of the processes used to form smooth ashable hard mask films is relatively high chamber pressure, e.g., at least about 2 Torr, and in particular embodiments at least about 4 Torr. In particular embodiments, pressures between 2-5 Torr are used, e.g., about 4.5 Torr. As with lowering the LF component, increasing pressure lowers the ion energy and so improves step coverage. Removing the LF component from a process lowers the deposition rate; in addition to lowering ion energy, increasing pressure increases deposition rate. Lowering the ion energy is particularly useful for improving the side wall coverage and roughness. Referring back to FIG. 3a, the bottom surface of the conventional process is smooth, while the side walls are rough. Ion sputter and etch yield are higher at 65°-80° angle of incidence than at normal incidence. By lowering the ion energy, the sputter and etch are lowered, which is especially beneficial for smooth side wall deposition. In certain embodiments, temperatures between 50-550 C. are used. Lower temperatures improve step coverage by lowering the carbon etch rate by hydrogen ions and radicals. Also in certain embodiments, low helium and/or hydrogen flow rates are used to improve step coverage and deposition rate. Helium flow rates between 500-10000 sccm and hydrogen flow rates between 500-10000 may be used.

In addition to the RF frequency, pressure, temperature and other conditions, precursor selection was found to significantly affect the smoothness and step coverage of the deposited film. Acetylene in particular was found to provide much higher step coverage and lower roughness than commonly used precursor propylene. FIG. 7 shows an image 701 of an ashable hard mask film deposited in a recessed feature of about 500 nm width using propylene as a precursor. The film is discontinuous along the side wall, as indicated at 703. For comparison, an image 705 of an ashable hard mask film deposited in the same size feature using acetylene is also shown. The film, indicated at 707, is continuous. Table 3, below, shows additional data comparing side coverage for acetylene and propylene based films. (The films deposited by processes G and H are shown in FIG. 7).

As discussed above, side coverage for the acetylene based film can be improved by removing the LF-component. The discrepancies in side wall and overall step coverage between the actelyene and propylene are stark, especially considering the similarity in chemical structure. Without being bound by any particular theory, it is believed that it may be due to the lower C:H ratio in propylene. During a PECVD process, plasma species include $C_xH_y$ ions and radicals and H ions and radicals. An H radical can saturate a dangling bond or saturate an SP2 bond to make an SP3 bond and a dangling bond. An H radical can also result in a dangling bond by abstraction. At higher temperatures, H radicals result in etching of carbon. Ions displace H atoms from the surface and create dangling bonds. The effective sticking coefficient for $C_xH_y$ radicals is a strong function of number of dangling bonds. If hydrogen radicals hydrogenate a dangling bond rather than abstracting a hydrogen from the surface, it reduces the number of dangling bonds. $C_xH_y$ species promote film growth and reduce dangling bonds. Depending on the precursor, however, an incoming $C_xH_y$ radical could rehybridize after adsorption on the surface and increase the available dangling bonds on the surface, thereby increasing the sticking coefficient. Precursors with lower C:H ratios—such as $CH_4$ (0.25) and $C_3H_6$ (0.5)—would result in more H radicals. Similarly higher H flux would also lead to larger H radical flux. The larger H radical flux resulting from these mechanisms would saturate the surface, decrease the number of dangling bonds, and decrease $C_xH_y$ deposition on the surface. At higher temperatures, the larger H flux may also increase the amount of carbon etching from the side walls. Both of these mechanisms would result in lower step coverage using precursors having lower C:H ratios, consistent with the results in Table 3. (It should be noted that there are many possible reaction mechanisms, and while the described mechanisms are consistent with obtained results, the methods are not limited to them.) In addition to the higher C:H ratio of acetylene, another possible mechanism in good step coverage achieved with acetylene is that the smaller $C_2H$-radicals and ions in the plasma easily rehybridize (SP bond converting to SP2) after adsorption, forming additional dangling bonds and increasing the sticking coefficient. Steric hindrance of large radicals formed the propylene precursor and the need for three adjacent dangling bonds for propylene radicals to stick reduces the effective sticking probability of these radicals.

Table 4 presents step coverage data for three precursors, $C_2H_2$, $C_3H_6$, and $C_7H_8$:

TABLE 4

C:H ratio and step coverage

| Precursor | C:H ratio | Step coverage | Side wall |
|---|---|---|---|
| C2H2 | 1 | 50% | Continuous |
| C7H8 | 0.875 | 50% | Continuous |
| C3H6 | 0.5 | almost 0 | Discontinuous |

Note that $C_7H_8$ has better step coverage than $C_3H_6$, suggesting that in this case, the C:H ratio is a more significant indicator of step coverage and side wall deposition than precursor size. Other precursors that have high C:H ratios (e.g., above about 0.75) may be used, including $C_6H_6$.

Figure 8:
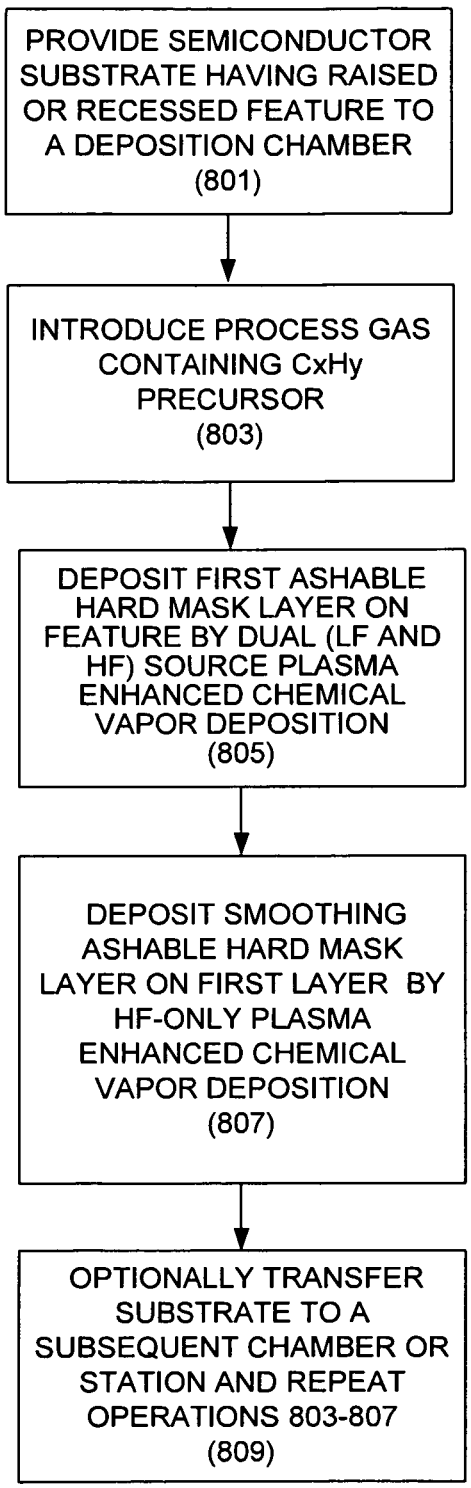
FIG. 8 shows a process of forming a combination ashable hard mask stack according to certain embodiments.
Figure 9A:
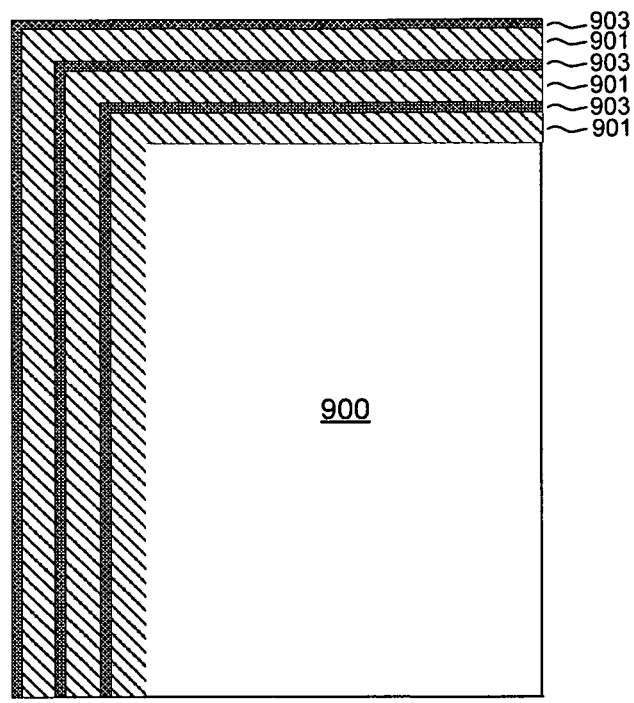
FIGS. 9a and 9b are schematics showing combination (first ashable hard mask layer and ashable hard mask smoothing layer) ashable hard mask films deposited on features.
Figure 9B:
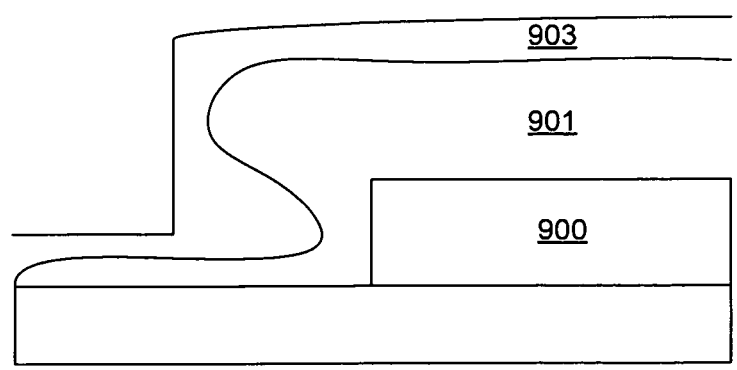

FIG. 8 shows a process of forming a combination ashable hard mask stack according to certain embodiments. In this process, a first ashable hard mask layer is deposited that is optimized for desired reflectivity, etch selectivity, etc. Methods of depositing highly selective transparent ashable hard mask films are described in U.S. patent application Ser. No. 11/449,983, filed Jun. 8, 2006 and incorporated by reference herein for all purposes. A "smoothing" ashable hard mask layer is then deposited on the first layer according to the methods described above with respect to FIG. 4. The process begins by providing a substrate having one or more features to a deposition chamber. Block 801. A gas including a hydrocarbon precursor is then introduced to the chamber. Block 803. The hydrocarbon precursor may be, for example, one defined by the formula $C_xH_y$, wherein x=2 to 10 and y=2-24, with examples including methane, acetylene, ethylene, propylene, butane, cyclohexane, benzene and toluene. In many embodiments, however, the precursor will be the same precursor that is to be used to form the smoothing layer, i.e., one with a high C:H ratio, such as acetylene. An ashable hard mask layer is then deposited by a PECVD process using a plasma generated with a dual LF+HF RF source. Block 805. Generally, this layer will be formed using a LF component to obtain the desired selectivity and optical characteristics. In other embodiments, it may be optimized for other desired film and/or process characteristics, such as deposition rate. While HF-only conditions have the best side wall coverage, these conditions produce films having low selectivity based on refractive index and blanket etch rates. In certain embodiments, at least about 80% of the total desired ashable hard mask film thickness is deposited using an LF-containing process. In most embodiments, the plasma will be generated using a dual (LF and HF) RF source as indicated in block 805. FIG. 8, though there may be certain processes in which LF-only source is used. A smoothing ashable hard mask layer is then deposited on the first layer. Block 807. In certain embodiments, depositing the smoothing layer may involve simply switching of the LF component. In other embodiment, other process conditions may also be changed, including raising pressure, changing flow rates (e.g., reducing hydrogen flow), shutting off certain gases, in accordance with the conditions described above. In particular, the pressure may be raised and/or the hydrogen flow shut off. The smoothing layer may be deposited in the same station of a multi-station deposition chamber as the first layer, or the substrate may be transferred to another station or chamber for smoothing layer deposition. As indicated, the precursor used in the smoothing layer deposition has a high C:H ratio, such as with acetylene. It has been found that using these methods, a film having both high selectivity and smooth side walls can be formed. Using previous processes, highly selective films formed in features have rough side walls. In certain embodiments, between about 5-25% of the total stack thickness is the smoothing layer, and more particularly between about 10-20%. In certain embodiments, the operations 803-807 are repeated to build up several layers. Using an apparatus having a multi-station sequential architecture, such as the VECTOR® apparatus by Novellus Systems, San Jose, Calif., this may be accomplished by transferring the substrate to a subsequent station and then depositing a combination layer. Block 809. FIG. 9a shows a feature 900 having an ashable hard mask stack deposited on it using such a process: layers 901 deposited using an LF component and layers 903 using an HF-only component. In certain embodiments, the thickness of each layer 901 is between about 100 to 10000 Angstroms and the thickness of each smoothing layer 903 about 10-20% of that thickness. Note that the schematic of FIG. 9a shows only the order in which the films are deposited and not the relative roughness or conformality of the first layer and the combined layer. For example, FIG. 9b, which also shows a smoothing layer 903 deposited on a first layer 901, shows the relatively poor step coverage of the first layer as compared to the combined film.

Table 5 shows results for films deposited using a method according to the process described in FIG. 8, as compared to ashable hard mask films deposited without the smoothing layer, and a film deposited using the conformal (HF-only) process. All films were deposited using a 4-station multistation PEVCD tool. 800 Angstroms were deposited at each station. For the combination films, 200 Angstroms of the 800 Angstroms were deposited using the HF-only process.

TABLE 5

Combination layer (Selective + Smoothing) process conditions

| | Layer | C2H2 Flow rate (sccm) | H2 Flow rate (sccm) | N2 Flow rate (sccm) | He Flow rate (sccm) | Temp (Celsius) | Pressure (Torr) | LF (W) | HF (W) |
|---|---|---|---|---|---|---|---|---|---|
| K | | 6000 | 1500 | 0 | 2500 | 300 | 1.2 | 1200 | 400 |
| L | | 6000 | 1500 | 0 | 2500 | 300 | 1.2 | 2400 | 400 |
| M | | 6000 | 0 | 0 | 2500 | 300 | 2 | 1200 | 400 |
| K+ | First layer | 6000 | 1500 | 0 | 2500 | 300 | 1.2 | 1200 | 400 |
| | Smoothing layer | 5000 | 0 | 1500 | 6000 | 300 | 4.5 | 0 | 1750 |
| L+ | First layer | 6000 | 1500 | 0 | 2500 | 300 | 1.2 | 2400 | 400 |
| | Smoothing layer | 5000 | 1500 | 1500 | 6000 | 300 | 4.5 | 0 | 1750 |

TABLE 5-continued

Combination layer (Selective + Smoothing) process conditions

| | Layer | C2H2 Flow rate (sccm) | H2 Flow rate (sccm) | N2 Flow rate (sccm) | He Flow rate (sccm) | Temp (Celsius) | Pressure (Torr) | LF (W) | HF (W) |
|---|---|---|---|---|---|---|---|---|---|
| M+ | First layer | 6000 | 1500 | 0 | 2500 | 300 | 2 | 1200 | 400 |
| | Smoothing layer | 5000 | 0 | 1500 | 6000 | 300 | 4.5 | 0 | 1750 |
| N | Conformal only | 5000 | 0 | 1500 | 6000 | 300 | 4.5 | 0 | 1750 |

Deposition rate, thickness non-uniformity, refractive index (n), extinction coefficient (k), side wall coverage, roughness, overhang, etch rate and etch selectivity were measured for the films. (Deposition rate, thickness non-uniformity, n and k were found for the first layer only). All films were deposited on features of dimension 500 nm Roughness and overhang measurements reflect averages of the left and right sides of the feature. Results are shown below in Table 6. Notably, in each case using the smoothing layer improves roughness+overhang.

TABLE 6

Combination layer (Selective + Smoothing) Step Coverage and Roughness + Overhang

| | Dep Rate (Å/min) | Thick NU % | n at 633 nm | k at 633 nm | $t_{side}/t_{top}$ | Roughness | Overhang | Roughness + Overhang | Etch Rate (Å/m) | Etch Selectivity |
|---|---|---|---|---|---|---|---|---|---|---|
| K | 4510 | 1.42 | 1.87 | 0.06 | 33.0% | 6.2% | 5.1% | 11.3% | 565 | 3.66 |
| K+ | | | | 0.06 | 42.9% | 2% | 8.5% | 10.5% | | |
| L | 7825 | 1.39 | 1.92 | 0.08 | 32.0% | 13.0% | 9.7% | 23.0% | 516 | 3.88 |
| L+ | | | | 0.08 | 38.1% | 5.4% | 8.4% | 13.8% | | |
| M | 6997 | 1.01 | 1.81 | 0.02 | 34.0% | 10.6% | 2.3% | 12.8% | 575 | 3.48 |
| M+ | | | | 0.02 | 46.5% | 7.2% | 4.4% | 11.6% | | |
| N | 4290 | 1.37 | 1.63 | 0.00 | 47.0% | 0.0% | 0.0% | 0.0% | 729 | 2.74 |

In certain embodiments, a combination layer having a first layer having a k of less than about 0.1 at 633 nm are deposited. In some embodiments, the extinction coefficients are less than about 0.05 at 633 nm.

The methods described herein may be performed using features of any dimension, with step coverage improving as the aspect ratio of the feature decreases. Side coverage of greater than 90% has been obtained for aspect rations of about 1:1, greater than 80% has been obtained for aspect ratios of about 2:1, greater than 60-70% for aspect ratios of about 3:1, greater than about 50-60% for aspect ratios as high as about 5:1. The feature may be an alignment mark or any other feature on a semiconductor substrate. In certain embodiments, e.g., wherein the feature is an alignment mark, side wall coverage is at least 50% or 60% to avoid attack during lithography rework. Lithographic rework generally involves photoresist removal, and may also involve organic anti-reflective coating removal, and in some cases reapplying the photoresist and anti-reflective coating and going through lithography and development again. In certain embodiments, side wall coverage is at least 60%, 70% or 80% as needed for the application. For example, the ashable hard mask films described herein may be used in double patterning schemes to increase feature density. These double patterning applications typically require better side wall coverage than needed to avoid attack during lithography rework.

Figure 10:
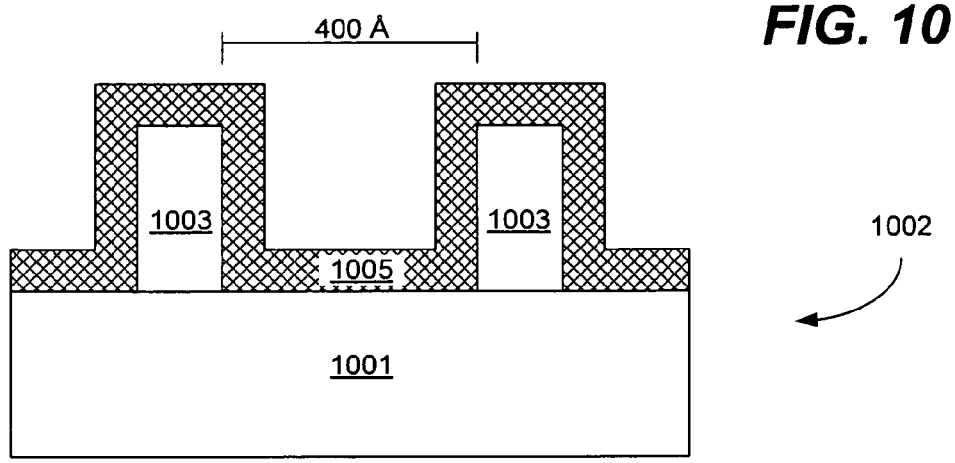
FIG. 10 depicts certain steps in an exemplary scheme for patterning a substrate using a conformal ashable hard mask film according to certain embodiments.
Figure 10:
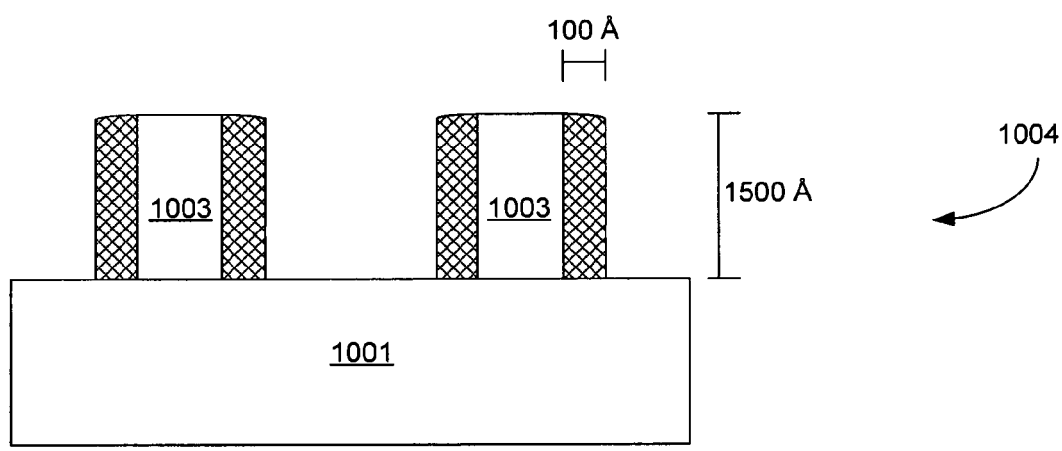
Figure 10:
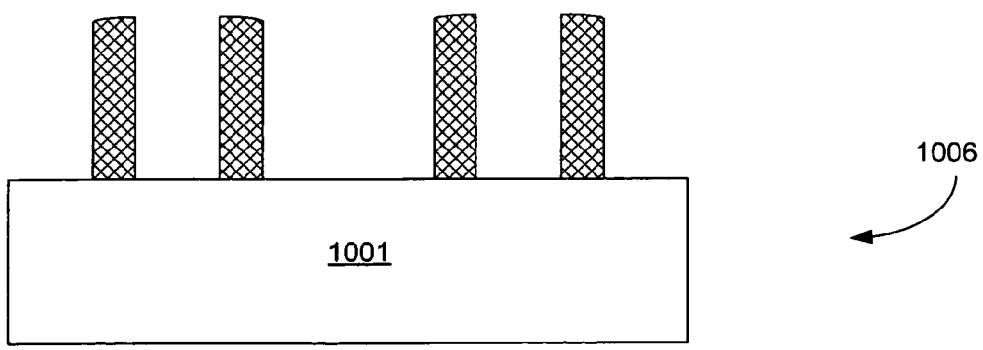

FIG. 10 shows an example of a portion of such a double patterning scheme. Etched substrate 1001 including features 1003 is shown at 1002. An ashable hard mask film 1005 is conformally deposited on features 1003. To form the structure shown in 1002, features 1003 may be formed by inorganic film deposition on the substrate, lithography and inorganic film etch. After resist removal and clean, the ashable hard mask is deposited, forming the structure shown 1002. The ashable hard mask is etched forming the structure shown at 1004. Inorganic film removal results in the structure 1006. The substrate can be subsequently etched, leaving features of smaller dimension/higher density than the originally etched substrate shown in 1002 without an additional lithography step. To this date, ashable hard mask films have not been suitable for these double patterning schemes as these schemes require step coverage of at least 70-80%, which are unobtainable with prior art methods. Example feature and film thicknesses are shown in FIG. 10: 100-200 Angstroms ashable hard mask material is deposited on a side wall of a trench having an aspect ration of about 4:1.

Apparatus

The present invention is implemented in a plasma enhanced chemical vapor deposition reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing hard mask deposition is transferred from one station to another within a reactor chamber during the process. For example, deposition of a highly selective ashable hard mask may take place at one of multiple deposition stations, then transferred to another station for smoothing layer deposition. In another example described briefly above, a portion of an ashable hard mask having the desired selectivity and/or optical properties is deposited in a station. The substrate then remains in that station for smoothing layer deposition before being transferred to a next station for deposition of another combination layer. The full film deposition may occur entirely at a single station or any fraction of the total film thickness may be deposited at any number of stations.

While in process, each wafer is held in place by a pedestal, wafer chuck and/or other wafer holding apparatus. For certain operations in which the wafer is to be heated, the apparatus may include a heater such as a heating plate. A Vector™ (e.g., C3 Vector) or Sequel™ (e.g., C2 Sequel) reactor, produced by Novellus Systems of San Jose, Calif., may be used to implement the invention.

Figure 11:
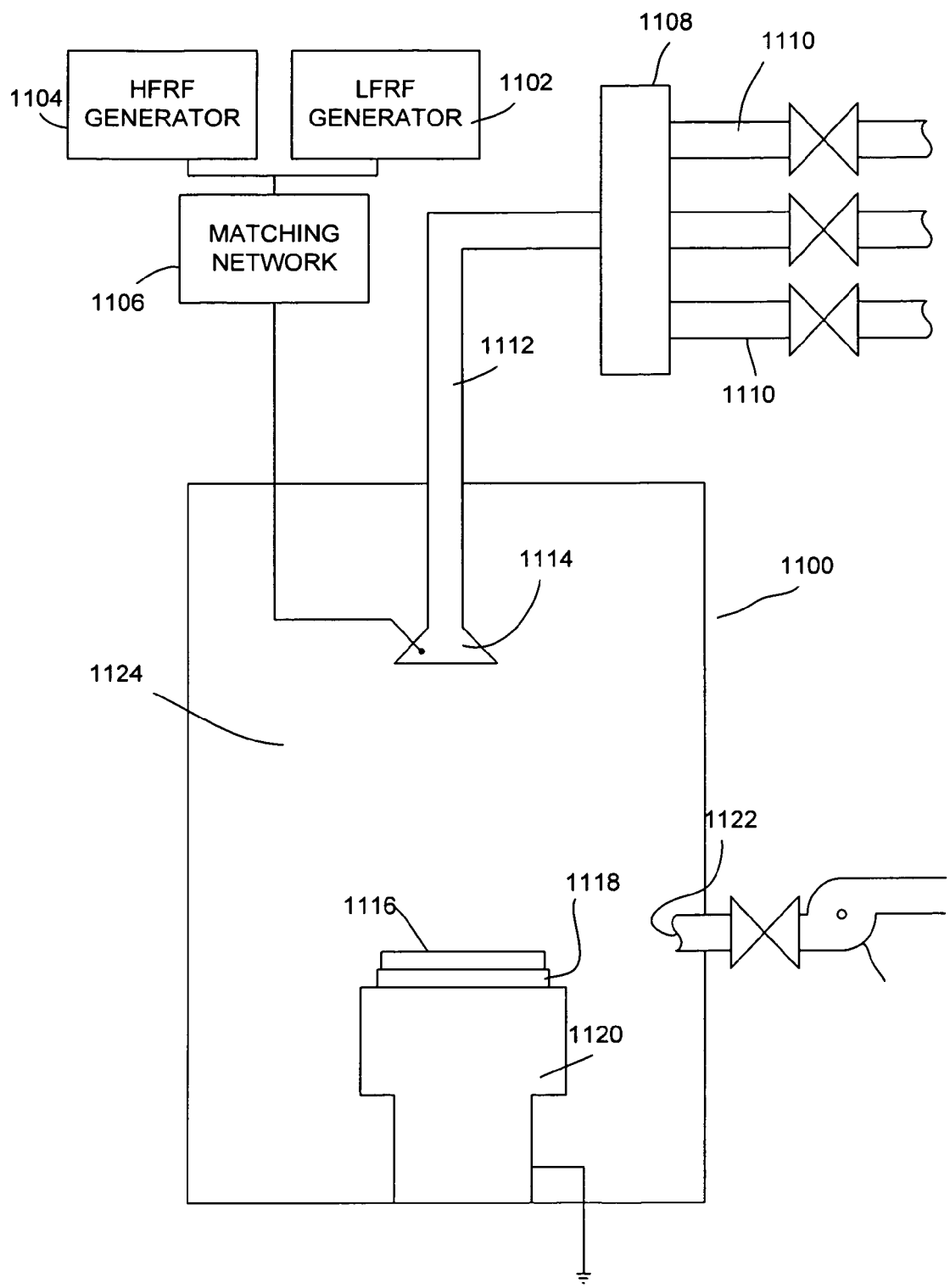
FIG. 11 is a simple block diagram depicting a PECVD reactor arranged for implementing the present invention.

FIG. 11 provides a simple block diagram depicting various reactor components arranged for implementing the present invention. As shown, a reactor 1100 includes a process chamber 1124, which encloses other components of the reactor and serves to contain the plasma generated by a capacitor type system including a showerhead 1114 working in conjunction with a grounded heater block 1120. A high-frequency RF generator 1104 and a low-frequency RF generator 1102 are connected to a matching network 1106 and to showerhead 1114. The power and frequency supplied by matching network 1106 is sufficient to generate a plasma from the process gas, for example 100-5000 W of HFRF power and 100-5000 W of LFRF power total energy. In a typical process, the high frequency RF component is generally between 5-60 MHz, e.g., 13.56 MHz. In operations wherein there is an LF component, the LF component can be from 100 kHz-2 MHz; e.g, 400 kHz.

Within the reactor, a wafer pedestal 1118 supports a substrate 1116. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 1112. Multiple source gas lines 1110 are connected to manifold 1108. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 1100 via an outlet 1122. A vacuum pump (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma treatment until all the required depositions and treatments are completed, or multiple depositions and treatments can be conducted at a single station before indexing the wafer.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein. The experimental data is provided to further illustrate aspects and advantages of the present invention. These examples are provided to exemplify and more clearly illustrate aspects of the present invention and are in no way intended to be limiting.

What is claimed is:

1. A method of forming an ashable hard mask, comprising:
   providing a substrate having a feature thereon to deposition chamber;
   introducing a hydrocarbon precursor having a C:H ratio of at least 0.875 to the deposition chamber;
   generating a plasma comprising activated hydrocarbon species in the deposition chamber using HF-only radio frequency power; and
   depositing an ashable hard mask film on the feature by plasma enhanced chemical vapor deposition under conditions such that the side wall coverage on the feature is at least 50%.

2. The method of claim 1 wherein chamber pressure is between about 2 and 5 Torr during deposition.

3. The method of claim 1 wherein the chamber pressure is at least about 2.5 Torr during deposition.

4. The method of claim 1 wherein the hydrocarbon precursor is in a process gas and the C:H ratio in the process gas is at least about 0.875.

5. The method of claim 4 wherein the C:H ratio in the process gas is about 1.

6. The method of claim 1 wherein the aspect ratio of the feature is at least about 2:1.

7. The method of claim 1 wherein the aspect ratio of the feature is at least about 3:1.

8. The method of claim 1 wherein the aspect ratio of the feature is at least about 4:1.

9. The method of claim 1 wherein the aspect ratio of the feature is at least about 5:1.

10. The method of claim 1 wherein the side wall coverage is at least about 60%.

11. The method of claim 1 wherein the side wall coverage is at least about 70%.

12. The method of claim 1 wherein the side wall coverage is at least about 80%.

13. The method of claim 1 wherein the side wall coverage is at least about 90%.

14. The method of claim 1 wherein the % roughness of the film deposited on the feature side wall is less than 5.0%.

15. The method of claim 1 wherein the % roughness of the film deposited on the feature side wall is less than 1.0%.

16. The method of claim 1 wherein the % overhang of the film deposited on the feature side wall is less than 1.0%.

17. The method of claim 1 wherein the hydrocarbon precursor is a $C_xH_y$ precursor, wherein x is between 2 and 10 and y is between 2 and 24.

18. A method of forming an ashable hard mask, comprising:
   providing a substrate having a feature thereon to deposition chamber;
   introducing a hydrocarbon precursor to the deposition chamber, wherein the hydrocarbon precursor is acetylene;

generating a plasma comprising activated hydrocarbon species in the deposition chamber using HF-only radio frequency power; and depositing an ashable hard mask film on the feature by plasma enhanced chemical vapor depositions under conditions such that the side wall coverage on the feature is at least 50%.

19. The method of claim 18 wherein chamber pressure is between about 2 and 5 Torr during deposition.

20. The method of claim 18 wherein the chamber pressure is at least about 2.5 Torr during deposition.

* * * * *